(12) United States Patent
Thimmegowda et al.

(10) Patent No.: US 9,865,357 B1
(45) Date of Patent: Jan. 9, 2018

(54) PERFORMING READ OPERATIONS ON A MEMORY DEVICE

(71) Applicant: Intel Corporation, Santa Clara, CA (US)

(72) Inventors: Deepak Thimmegowda, Fremont, CA (US); Pranav Kalavade, San Jose, CA (US); Aaron Yip, Los Gatos, CA (US); Shantanu R. Rajwade, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/395,700

(22) Filed: Dec. 30, 2016

(51) Int. Cl.
G11C 16/26 (2006.01)
G11C 16/08 (2006.01)

(52) U.S. Cl.
CPC .............. G11C 16/26 (2013.01); G11C 16/08 (2013.01)

(58) Field of Classification Search
CPC ................................ G11C 16/26; G11C 16/10
USPC ....................................... 365/185.18, 185.24
See application file for complete search history.

(56) References Cited

U.S. PATENT DOCUMENTS

| | | | | |
|---|---|---|---|---|
| 9,030,870 | B2 * | 5/2015 | Moschiano | G11C 11/5628 365/185.03 |
| 2009/0141545 | A1 * | 6/2009 | Norman | G11C 5/02 365/163 |
| 2009/0238005 | A1 * | 9/2009 | You | G11C 16/26 365/185.18 |
| 2011/0047324 | A1 * | 2/2011 | Norman | G06F 12/0246 711/103 |
| 2012/0020161 | A1 * | 1/2012 | Haukness | G06F 12/0246 365/185.17 |
| 2012/0176834 | A1 * | 7/2012 | Ikeda | H01L 27/0688 365/148 |
| 2012/0268992 | A1 * | 10/2012 | Kim | G11C 16/3418 365/185.11 |
| 2013/0128675 | A1 * | 5/2013 | Kim | G11C 7/10 365/189.05 |
| 2013/0173844 | A1 * | 7/2013 | Chen | G06F 12/0246 711/103 |
| 2016/0012891 | A1 * | 1/2016 | Intrater | G11C 13/0069 365/148 |
| 2016/0071597 | A1 * | 3/2016 | Kokubun | G11C 7/1006 714/807 |
| 2016/0133329 | A1 * | 5/2016 | Moon | G11C 16/14 365/185.11 |
| 2016/0179399 | A1 * | 6/2016 | Melik-Martirosian | G06F 3/0608 711/103 |

\* cited by examiner

*Primary Examiner* — Michael Tran
(74) *Attorney, Agent, or Firm* — Thorpe North & Western, LLP; David W. Osborne

(57) ABSTRACT

Technology for performing read operations in a memory device or system is described. The device or system can include an array of memory cells. The device or system can include a first decode circuit, and can further include a second decode circuit. The device or system can include a voltage regulator configured to perform a read operation by providing, based on one or more signals received from at least one of the first decode circuit or the second decode circuit, a voltage to a selected plane or a selected sub-plane in the array of memory cells.

23 Claims, 9 Drawing Sheets

|  | 16K Read (One plane) | | |
|---|---|---|---|
|  | Relative WLC Loading | Read Performance Improvement | Read Energy Improvement |
| Driver per Plane | 0.62 | 5.70% | 2.28% |
| Driver per Tile Group | 0.62 | 5.70% | 2.28% |

FIG. 6A

|  | 8K Read (Tile Group) | | |
|---|---|---|---|
|  | Relative WLC Loading | Read Performance Improvement | Read Energy Improvement |
| Driver per Plane | 0.50 | 8.07% | 3.03% |
| Driver per Tile Group | 0.41 | 9.42% | 3.53% |

FIG. 6B

PERFORMING READ OPERATIONS ON A MEMORY DEVICE

BACKGROUND

Memory devices are typically provided as internal, semiconductor, integrated circuits in computers or other electronic devices. There are many different types of memory including volatile memory, for example, dynamic random access memory (DRAM), synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein:

FIGS. 6A and 6B are tables that illustrate an improvement in read performance when using a decode scheme in an array of memory cells in accordance with an example embodiment;

Figure 1:
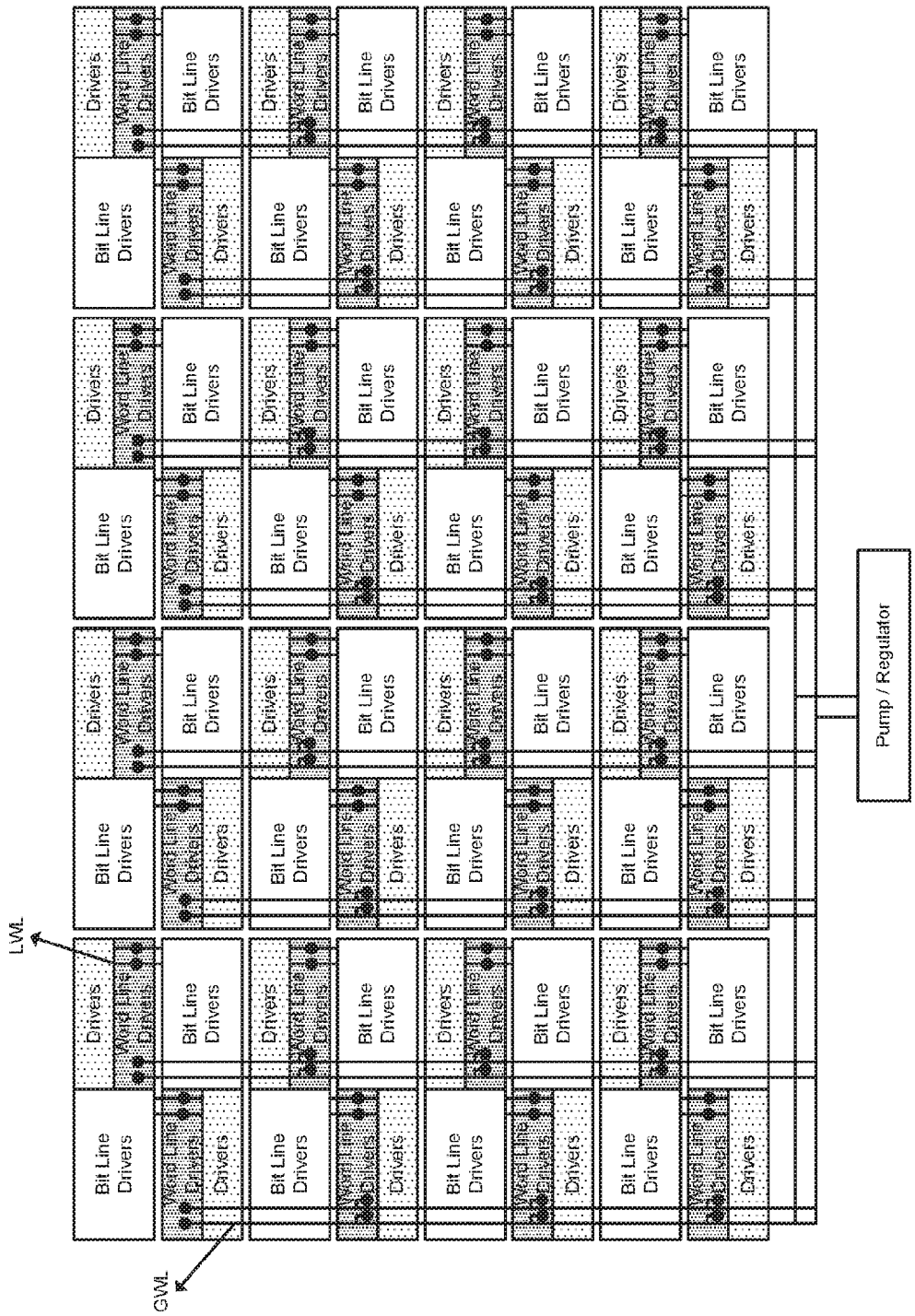
FIG. 1 illustrates an array of memory cells with a loading in local word lines and global word lines in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" expressly include plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

NAND devices, such as vertical NAND devices, can include an array of memory cells (or a NAND die). The array of memory cells can be in accordance with a tile-based architecture. The array of memory cells can be defined by columns, which can be referred to as bit lines, and rows, which can be referred to as word lines. A memory cell can be located at each cross point in the array of memory cells. A global word line can span across multiple memory cells in the array of memory cells, while a local word line can be for a specific memory cell in the array of memory cells. When performing read operations, the word lines (or gates) can be driven to high voltages so that a charge is trapped in the gates. The array of memory cells can have an associated voltage pump (or voltage regulator) to drive a voltage to the word lines accordingly. In other words, the voltage pump (or voltage regulator) can drive the voltage to each of the planes in the array of memory cells. Each NAND die can have at least one voltage pump or voltage regulator.

As a non-limiting example, in order to perform the read operation, the voltage pump can drive a voltage from 2 volts to 25 volts, such that the 25 volts is being provided to an appropriate word line (or gate).

In one example, a NAND device can include two circuit components—the array of memory cells that stores data, and logic circuitry that controls the movement of data to and from the array of memory cells. The NAND device can utilize complementary metal-oxide-semiconductor (CMOS) circuit components, or logic, that is underneath or outside the array of memory cells in the NAND device. In this case, the voltage pump (or voltage regulator) can be positioned underneath or outside the array of memory cells within the NAND device.

Plane read operations and sub-plane read operations are important system parameters in vertical NAND devices. Plane read operations can involve reading a selected plane in an array of memory cells in the vertical NAND device. Sub-plane operations can involve reading a selected sub-plane in the array of memory cells in the vertical NAND device. Sub-plane operations can also be referred to as snap read operations. Each plane in the array of memory cells can include a defined number of blocks, and each block can include a defined number of pages of data. In one example, the ability to perform the plane read operations and sub-plane read operations in a reduced amount of time is an important objective for vertical NAND devices. In other words, the amount of time to perform the plane read and sub-plane read operations can be indicative of a performance level for the vertical NAND device.

As non-limiting examples, the selected plane of memory cells can have a load of 16 kilobytes (KB) or 32 KB, and the selected sub-plane of memory cells can have a load of 4 KB or 8 KB.

In some tile-based vertical NAND architecture, the routing in the array of memory cells connects the voltage pump (or voltage regulator) to all of the global word lines (or gates) in the array of memory cells. With respect to read operations, when the voltage pump (or voltage regulator) drives a voltage in one specific word line in the array of memory cells, other word lines in the array of memory cells are also exposed to the voltage from the voltage pump (or voltage regulator).

In some solutions, the voltage pump (or voltage regulator) can be exposed to a global word line load (e.g., a metal routing and word line driver junction capacitance) of all memory cells in the array of memory cells. In other words, due to global routing that connects all of the word lines in the array of memory cells, the voltage pump (or voltage regulator) can see the global word line load (or capacitance) for all of the global word lines in the array of memory cells. An exposure to the global word line load (or capacitance) for all planes in the array of memory cells can add an additional capacitance to a target memory cell (i.e., a memory cell for which a read operation is performed). This additional capacitance on the target memory cell (which has to be charged by the voltage pump during the read operation) can result in a degraded read performance. In other words, the degraded read performance can be due to the increased amount of time needed to charge the target memory cell due to the additional capacitance.

In some invention embodiments, a word line load (or capacitance) can be isolated for each word line in the array of memory cells, which can reduce a global word line load (or capacitance) exposed to each word line. A reduction in the global word line load (or capacitance) decreases an amount of time required to perform a read operation (i.e., an improvement in read performance). In other words, the global word line load can be decoupled from a local word line load seen by the particular word line during a read operation (e.g., a plane read operation or a sub-plane read operation), and this decoupling can improve the read performance. The reduction in the global word line load (or capacitance) seen by the word line can decrease the amount of time it takes the voltage pump (or regulator) to drive the voltage to the word line, thereby improving the read performance.

More specifically, one or more decode circuits (e.g., a 1 bit decode circuit and/or 2 bit decode circuit) can be added to a global word line path, which results in each word line being isolated from the global word line load. The addition of the decode circuits to the global word line path can cause only a word line load corresponding to a particular memory cell (or group of memory cells) to be enabled, while other word line loads from other memory cells (or groups of memory cells) are disabled. By reducing a total global word line load (or total capacitance) seen by the word line, the read performance can be improved. The decode circuits can cut off the global word line load from memory cells that are disabled, and restrict a routing and word line driver load to only the memory cells that see a local word line load (or capacitance) during read operations. In one example, the isolation between word line loads in the array of memory cells can be useful in tile-based vertical NAND architectures, in which an increased number of metal routing layers and word line drivers are added to the global word line paths.

In some invention embodiments, the tile-based vertical NAND architecture utilizes a mechanism in which a global word line load from disabled memory cells is reduced in a load or capacitance path. Due to increases in a local word line capacitance, increases in the number of metal layers into a global word line path and increases in a number of word line driver transistors in the array of memory cells, there is a need to reduce the total global word line load (or total capacitance) seen by the word line, and the use of decode circuits can result in a reduction in the total global word line load (or total capacitance) seen by the word line.

FIG. 1 illustrates an exemplary array of memory cells with a loading in local word lines and global word lines. The array of memory cells can be part of a vertical NAND flash memory device that utilizes a tile-based architecture. In other words, each memory cell in the array can be referred to as a tile, and groups of memory cells in the array can be referred to as tile groups. As a non-limiting example, each memory cell in the array of memory cells can store an amount of data, such as 2 KB of data.

In one example, a word line can be split into tiles of bit lines due to a relatively large word line resistance. In addition, a global word line (GWL) can span across multiple memory cells in the array of memory cells, while a local word line (LWL) can be for a specific memory cell in the array of memory cells.

In one configuration, a voltage pump (or voltage regulator) can be under the array of memory cells or outside the array of memory cells. The voltage pump (or voltage regulator) can be used to drive a voltage to the memory cells in the array of memory cells. In this configuration, there can be one voltage pump (or voltage regulator) for each NAND die. The global word lines and the local word lines can be routed to the voltage pump (or regulator). Since a single voltage pump (or voltage regulator) can be used to drive the voltage to all of the memory cells in the array, the single voltage pump (or voltage regulator) can be exposed to a global word line capacitance from all of the memory cells in the NAND die.

In one configuration, each memory cell can include bit line drivers, word line drivers and other drivers. The bit line drivers can be CMOS sensing circuits that are utilized for bit line sensing. In other words, the bit line drivers can be circuits that are connected to a bit line of a memory cell (which corresponds to a drain side), and the bit line drivers can sense voltage/current on the bit line side of the memory cell. The word line drivers can be circuits that are connected to a word line of a memory cell, and the word line drivers can be used to pass a gate voltage for the memory cell. In other words, the word line drivers can be used to drive voltage to a gate in the memory cell. The other drivers can be circuits that are used to drive different voltages to other parts of the NAND die. In addition, the other drivers can bias the bit line drivers and the word line drivers.

Figure 2:
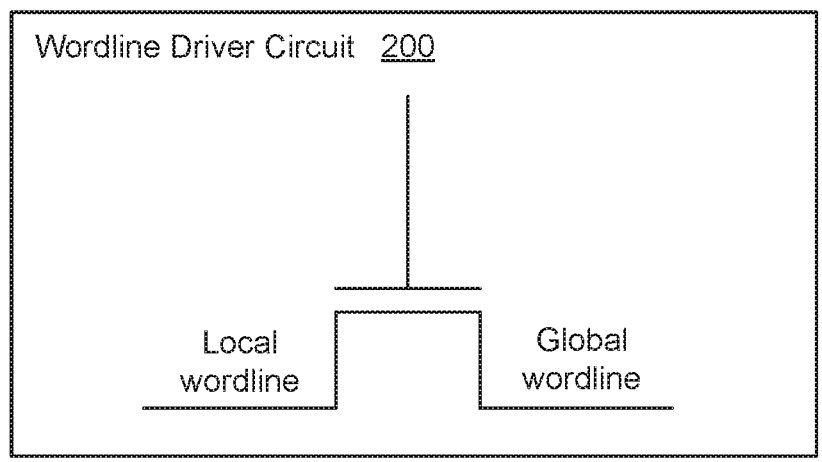
FIG. 2 illustrates a word line driver circuit with a connection between a local word line and a global word line in accordance with an example embodiment.

FIG. 2 illustrates an exemplary word line driver circuit 200 with a connection between a local word line and a global word line. The global word line can be connected across multiple memory cells (or tiles) for each word line. The global word line can be included in an array of memory cells, and the array of memory cells can be in accordance with a tile-based vertical NAND architecture. The global word line can be connected to a voltage pump (or voltage regulator). The voltage pump (or voltage regulator) can pump a voltage to memory cells (or tiles) when performing read operations. As a result, each global word line in the array of memory cells can see a capacitance from a word line driver junction, metal routing and interconnect contacts. This capacitance can be referred to as a global word line capacitance. As discussed below, as vertical NAND architectures experience increased capacitance from local word lines and additional planes per NAND die, there becomes a need to reduce the global word line capacitance.

Figure 3:
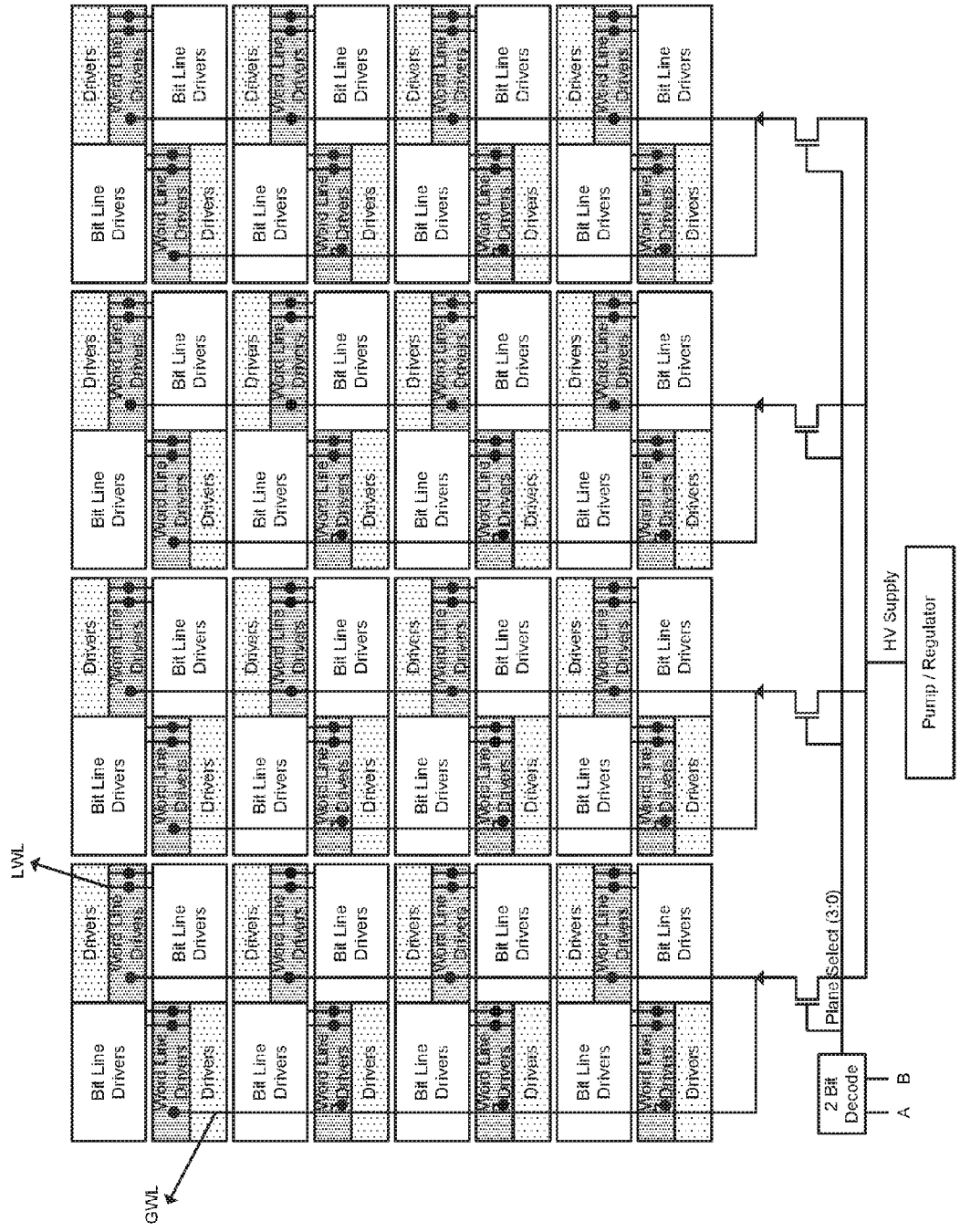
FIG. 3 illustrates an array of memory cells with a decode scheme that isolates a global word line load between planes in the array of memory cells in accordance with an example embodiment.

FIG. 3 illustrates an exemplary array of memory cells with a decode scheme that isolates a global word line load (or capacitance) between planes in the array of memory cells. The array of memory cells can be part of a vertical NAND flash memory device that utilizes a tile-based architecture. In other words, each memory cell in the array can be referred to as a tile, and groups of memory cells in the array can be referred to as tile groups. In addition, a global word line (GWL) can span across multiple memory cells in the array of memory cells, while a local word line (LWL) can be for a specific memory cell in the array of memory cells.

As shown in FIG. 3, a decode circuit can be utilized to isolate a global word line load (or capacitance) per each plane in the array of memory cells. A plane can refer to a group of memory cells in the array. In this example, the array of memory cells can include four planes. Therefore, the decode circuit can be a 2-bit decode circuit. The number of bits used by the decode circuit can be modified accordingly based on the number of planes in the array of memory cells.

The decode circuit, in conjunction with a plane select switch, can be used to enable a certain plane in the array of memory cells, and the decode circuit can disable remaining planes in the array of memory cells. In other words, the decode circuit can function to isolate the global word line load (or capacitance) for each plane in the array of memory cells. When driving a word line in a given plane to perform a plane read operation, the decode circuit and the plane select switch can be used to only drive the voltage to that given plane. Since the remaining planes can be disabled, the voltage may not be driven to the remaining planes. As a result, a global word line load (or capacitance) from disabled planes does not affect a load or capacitance path of the given plane, which can improve a read performance when reading data from the given plane (i.e., a plane read operation).

As a non-limiting example, the array of memory cells can include four planes, and a 2-bit decode circuit can include bits A and B. When the voltage pump (or voltage regulator) is to drive a voltage in a third plane, A can be set to 1 and B can be set to 0. As a result, the third plane can be enabled, and the first, second and fourth planes can be disabled. The voltage pump (or voltage regulator) can drive the voltage only to the third plane. Since the first, second and fourth planes are isolated from the third plane, the voltage pump (or voltage regulator) does not see a global word line load (or capacitance) from the first, second and fourth planes. The absence of the global word line load (or capacitance) can result in a decreased capacitance being seen by the voltage pump (or voltage regulator) for the third plane. The decreased capacitance can lead to a reduced amount of time that required to drive the voltage to the third plane, thereby improving a performance level of a plane read operation.

Figure 4:
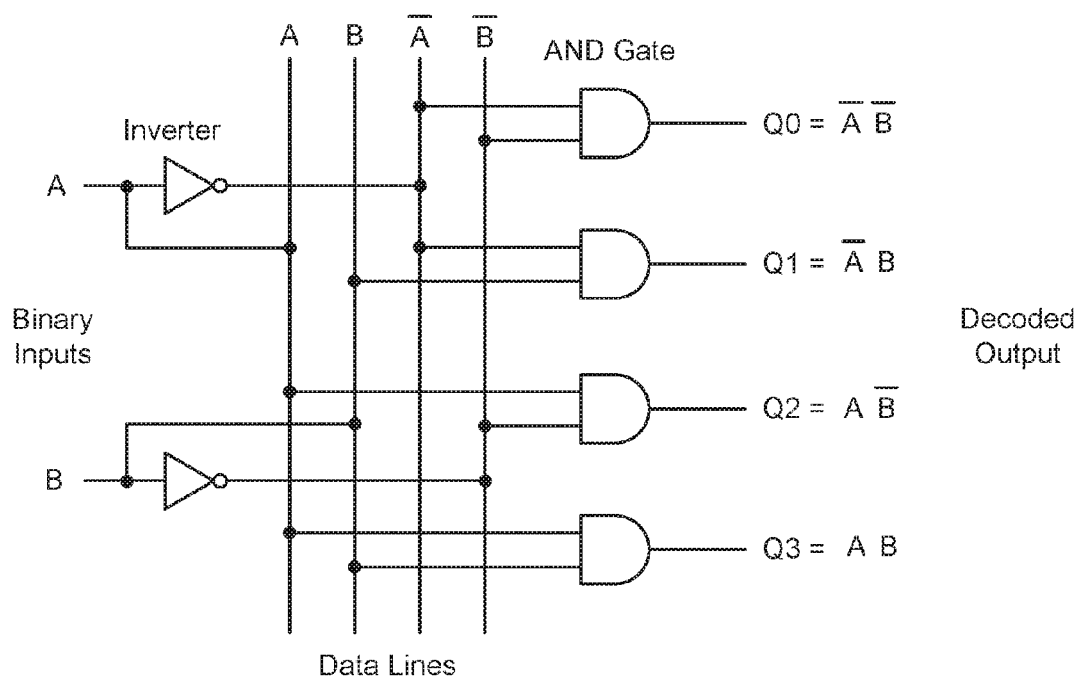
FIG. 4 illustrates a decode circuit in accordance with an example embodiment.

FIG. 4 illustrates an exemplary decode circuit. The decode circuit can be utilized to isolate a global word line load (or capacitance) per each plane in the array of memory cells. In this example, when the array of memory cells includes four planes, the decode circuit can be a 2-bit decode circuit with inputs A and B. The inputs A and B can be binary inputs (i.e., A can be set to 0 or 1, and B can be set to 0 or 1). The inputs A and B can be provided from a controller. Using a combination of two inverters and four AND gates, four possible decoded outputs can be produced from the binary inputs. The decoded outputs can correspond to the four planes in the array of memory cells.

While a 2-bit decode circuit can have inputs A and B when the array of memory cells include four planes, the decode circuit can be appropriately modified depending on the number of planes in the array of memory cells.

As shown in FIG. 4, the decode circuit can be a standard NAND gate based circuit. A length and width of the gates used can be selected based on a load driving capacity. As previously explained, the inputs A and B (or decode inputs A and B) can be used to select a given plane in the array of memory cells, and a total global word line load (or capacitance) seen by a local word line can be decreased by a maximum of approximately one fourth, as compared to previous solutions (e.g., as shown in FIG. 1). The decrease in the total global word line load (or capacitance) can result in an improvement to single plane read operations for tile-based vertical NAND architectures.

Figure 5:
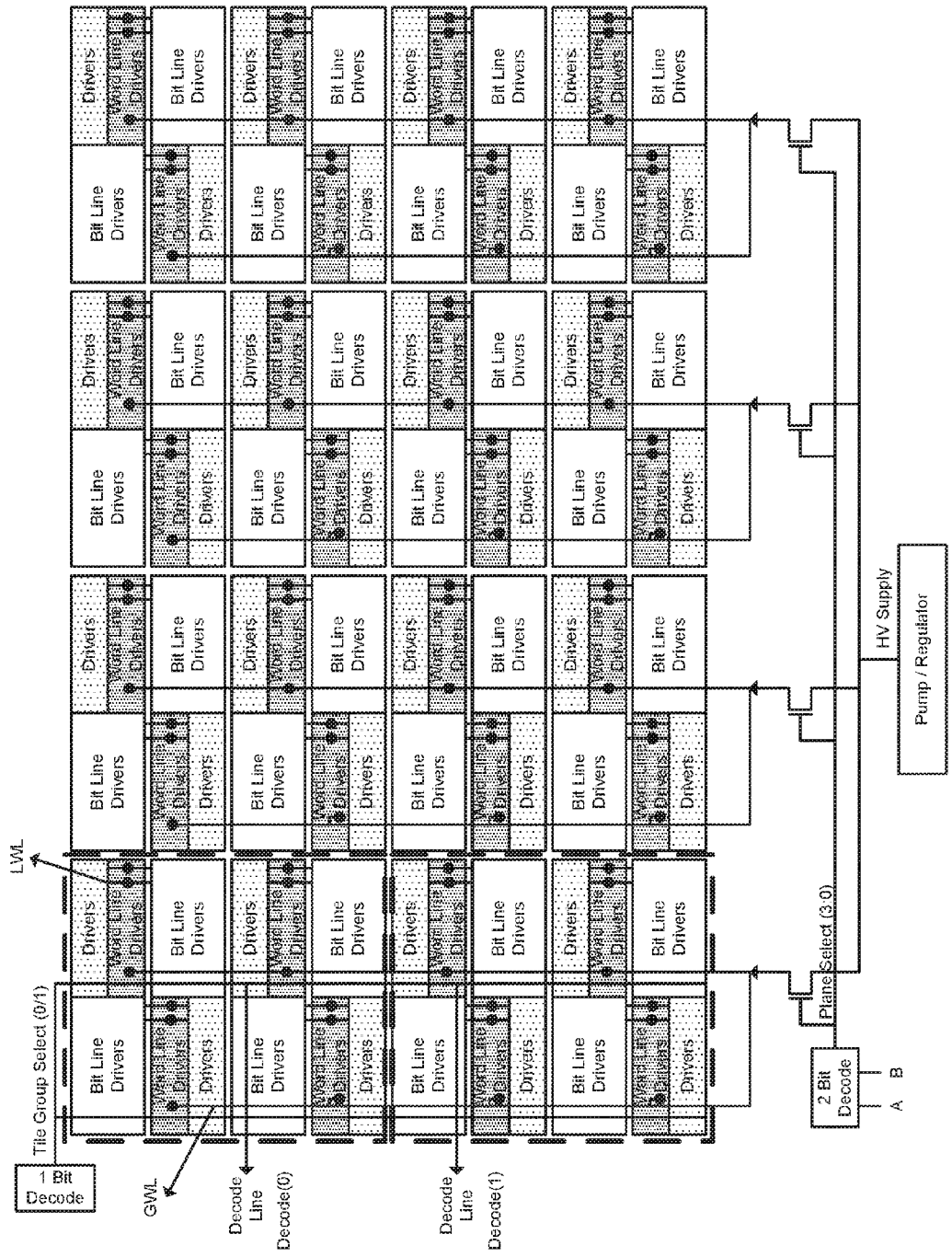
FIG. 5 illustrates an array of memory cells with a decode scheme that isolates a global word line load between subplanes in the array of memory cells in accordance with an example embodiment.

FIG. 5 illustrates an exemplary array of memory cells with a decode scheme that isolates a global word line load (or capacitance) between sub-planes in the array of memory cells. The array of memory cells can be part of a vertical NAND flash memory device that utilizes a tile-based architecture. In addition, a global word line (GWL) can span across multiple memory cells in the array of memory cells, while a local word line (LWL) can be for a specific memory cell in the array of memory cells.

As shown in FIG. 5, multiple decode circuits can be utilized to isolate a global word line load (or capacitance) per each sub-plane in the array of memory cells. A sub-plane can refer to a group of memory cells in the array, and the sub-plane can be a portion of a plane in the array. In this example, the array of memory cells can include four planes, and a first plane can include two sub-planes.

In one example, a first decode circuit can be used to select an appropriate plane in the array of memory cells, and a second decode circuit can be used to select an appropriate sub-plane in the appropriate plane in the array of memory cells. For example, the first decode circuit can be a 2-bit decode circuit, and the second decode circuit can be a 1-bit decode circuit. The number of bits used by the first decode circuit can be modified accordingly based on the number of planes in the array of memory cells, and the number of bits used by the second decode circuit can be modified accordingly based on the number of sub-planes within each plane in the array of memory cells. In one example, the second decode circuit (e.g., the 1-bit decode circuit) can be an inverter gate. As shown, the second decode circuit can include a decode routing line across groups of memory cells (or tile groups) in the array of memory cells. In addition, the drivers in the array of memory cells can be split per memory cell group (or tile group).

The first and second decode circuits, in conjunction with a plane select switch, can be used to enable a certain sub-plane in the array of memory cells, and remaining sub-planes in the array of memory cells can be disabled. In other words, the first and second decode circuits can function to isolate the global word line load (or capacitance) for each sub-plane in the array of memory cells. The global word line load (or capacitance) can be isolated to a certain group of memory cells (or tile group) in the array. When driving a word line in a given sub-plane to perform a sub-plane read operation (e.g., snap read operation), the first and second decode circuits and the plane select switch can be used to only drive the voltage to that given sub-plane. Since the remaining sub-planes can be disabled, the voltage may not be driven to the remaining sub-planes. As a result, a global word line load (or capacitance) from disabled sub-planes does not affect a load or capacitance path of the given sub-plane, which can improve a read performance when reading data from the given sub-plane (i.e., a sub-plane read operation).

In one example, the sub-plane read operation (or snap read operation) is an important system parameter that can be used to calculate a random read input/output operations per second (IOPS) of the memory system, and a reduced global word line load (or capacitance) can result in faster TOPS numbers.

As a non-limiting example, the array of memory cells can include four planes, and each plane can include two sub-planes. A 2-bit decode circuit can include bits A and B, and a 1-bit decode circuit can include bit C. The bits A, B and C can each be either 0 or 1, depending on decode signals received from a controller (not shown). For example, the controller can send a first decode signal (indicating values for A and B) to the 2-bit decode circuit, and the controller can send a second decode signal (indicating a value for C) to the 1-bit decode circuit. When the voltage pump (or voltage regulator) is to drive a voltage in a second sub-plane of a fourth plane, A can be set to 1, B can be set to 1, and C can be set to 1 (as indicated by the first and second decode signals). As a result, the second sub-plane of the fourth plane can be enabled, and remaining sub-planes in the first, second and third planes can be disabled (including the first sub-plane in the fourth plane). The voltage pump (or voltage regulator) can drive the voltage only to the second sub-plane in the fourth plane. Since the remaining sub-planes are isolated from the second sub-plane in the fourth plane, the voltage pump (or voltage regulator) does not see a global word line load (or capacitance) from the remaining sub-planes. The absence of the global word line load (or capacitance) can result in a decreased capacitance being seen by the voltage pump (or voltage regulator) for the second sub-plane in the fourth plane. The decreased capacitance can lead to a reduced amount of time that it takes to drive the voltage to the second sub-plane in the fourth plane, thereby improving a performance level of a sub-plane read operation (or snap read operation). In this example, the second sub-plane in the fourth plane can include 4 KB of data.

In one example, the area of the decode circuits relative to the voltage pump (or voltage regulator) or an area of a NAND die can be minimal (e.g., less than one percent of a total area of the NAND die), even when accounting for additional routing lines due to the decode circuits.

FIG. 6A is a table that illustrates an improvement in plane read performance when using a decode scheme in an array of memory cells. In this example, one plane can include 16 KB of data. When there is one driver per plane in an array of memory cells, a relative wear leveling count (WLC) loading can be approximately 0.62, a read performance over previous solutions can be approximately 5.7%, and a read energy improvement over previous solutions can be approximately 2.3%. When there is one driver per memory cell group (or tile group) in an array of memory cells, the relative WLC loading can be approximately 0.62, the read performance over previous solutions can be approximately 5.7%, and the read energy improvement over previous solutions can be approximately 2.3%.

FIG. 6B is a table that illustrates an improvement in sub-plane read performance when using a decode scheme in an array of memory cells. In this example, one sub-plane can include 16 KB of data. When there is one driver per plane in an array of memory cells, a relative wear leveling count (WLC) loading can be approximately 0.50, a read performance over previous solutions can be approximately 8.0%, and a read energy improvement over previous solutions can be approximately 3.0%. When there is one driver per memory cell group (or tile group) in an array of memory cells, the relative WLC loading can be approximately 0.41, the read performance over previous solutions can be approximately 9.4%, and the read energy improvement over previous solutions can be approximately 3.5%.

Figure 7:
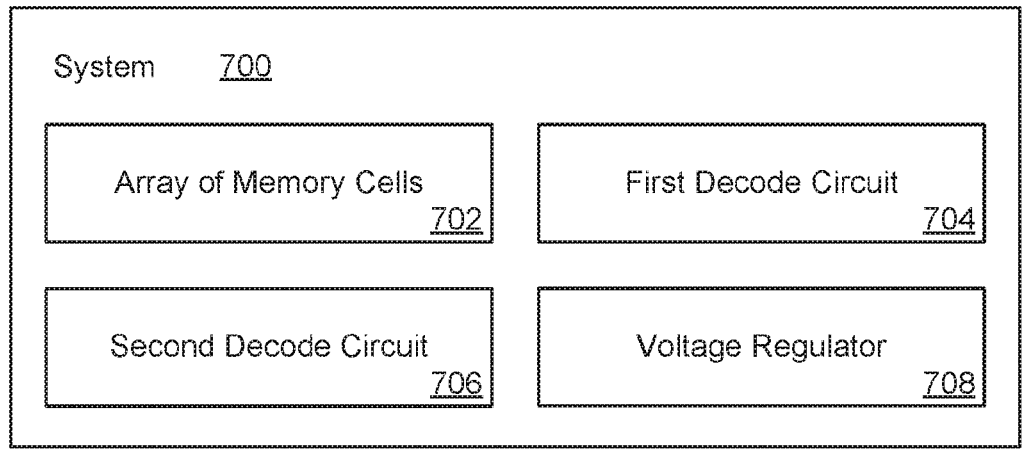
FIG. 7 is a diagram of a system for performing read operations in accordance with an example embodiment.

FIG. 7 illustrates an exemplary system 700 for performing read operations. The system 700 can include an array of memory cells 702. The system 700 can include a first decode circuit 704. The system 700 can include a second decode circuit 706. The system 700 can include a voltage regulator 708 configured to perform a read operation by providing, based on one or more signals received from at least one of the first decode circuit 704 or the second decode circuit 706, a voltage to a selected plane or a selected sub-plane in the array of memory cells 702.

Figure 8:
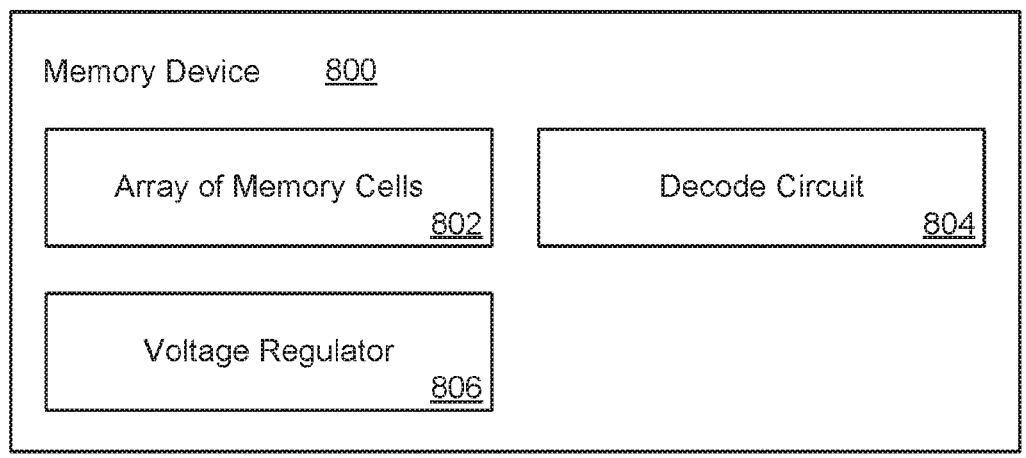
FIG. 8 is a diagram of a memory device operable to perform read operations in accordance with an example embodiment.

FIG. 8 illustrates an exemplary memory device 800 operable to perform read operations. The memory device 800 can include an array of memory cells 802. The memory device 800 can include a decode circuit 804. The memory device 800 can include a voltage regulator 806 configured to perform a read operation by providing, based on a signal received from the decode circuit 804, a voltage to a global bit line in a selected plane in the array of memory cells 802, and remaining planes in the array of memory cells 802 are not exposed to the voltage provided to the global bit line in the selected plane.

Figure 9:
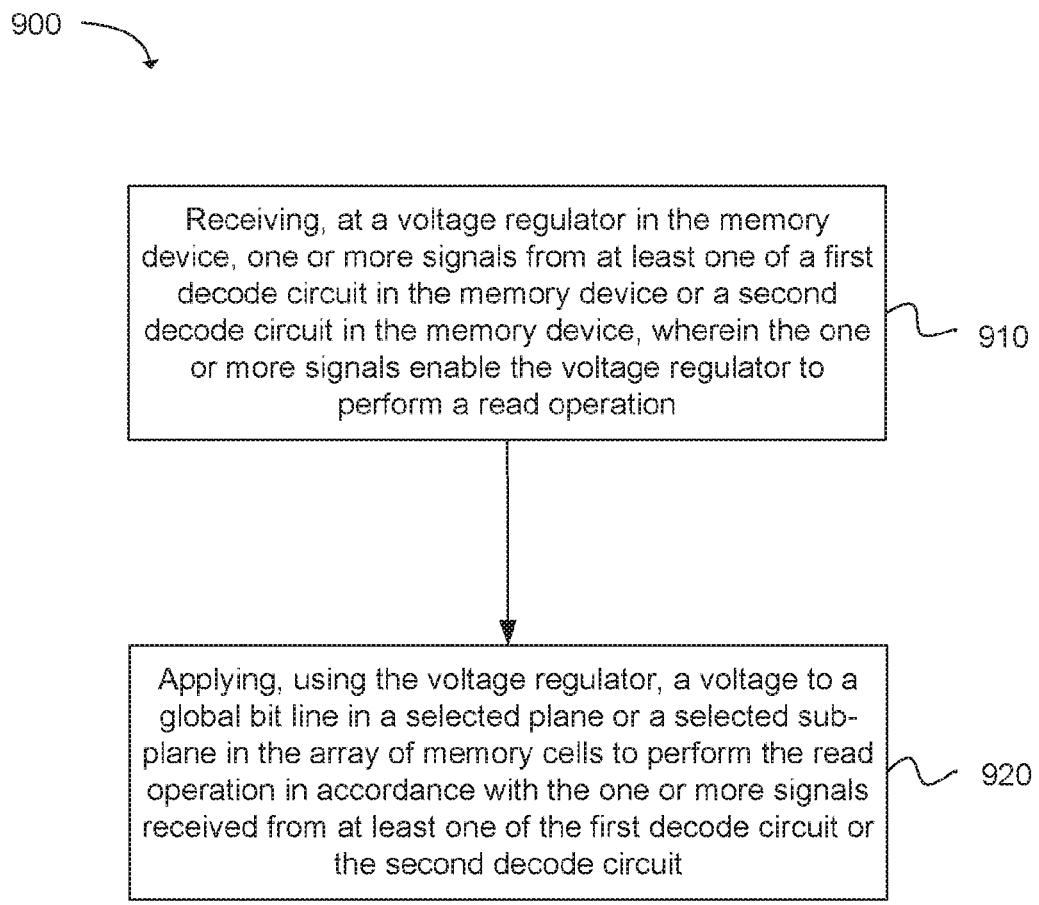
FIG. 9 depicts a flowchart of a method for performing read operations on a memory device in accordance with an example embodiment.

Another example provides a method 900 for performing read operations on a memory device, as shown in the flow chart in FIG. 9. The method can be executed as instructions on a machine, where the instructions are included on at least one computer readable medium or one non-transitory machine readable storage medium. The method can include the operation of: receiving, at a voltage regulator in the memory device, one or more signals from at least one of a first decode circuit in the memory device or a second decode circuit in the memory device, wherein the one or more signals enable the voltage regulator to perform a read operation, as in block 910. The method can include the operation of: applying, using the voltage regulator, a voltage to a global bit line in a selected plane or a selected sub-plane in the array of memory cells to perform the read operation in accordance with the one or more signals received from at least one of the first decode circuit or the second decode circuit, as in block 920.

Figure 10:
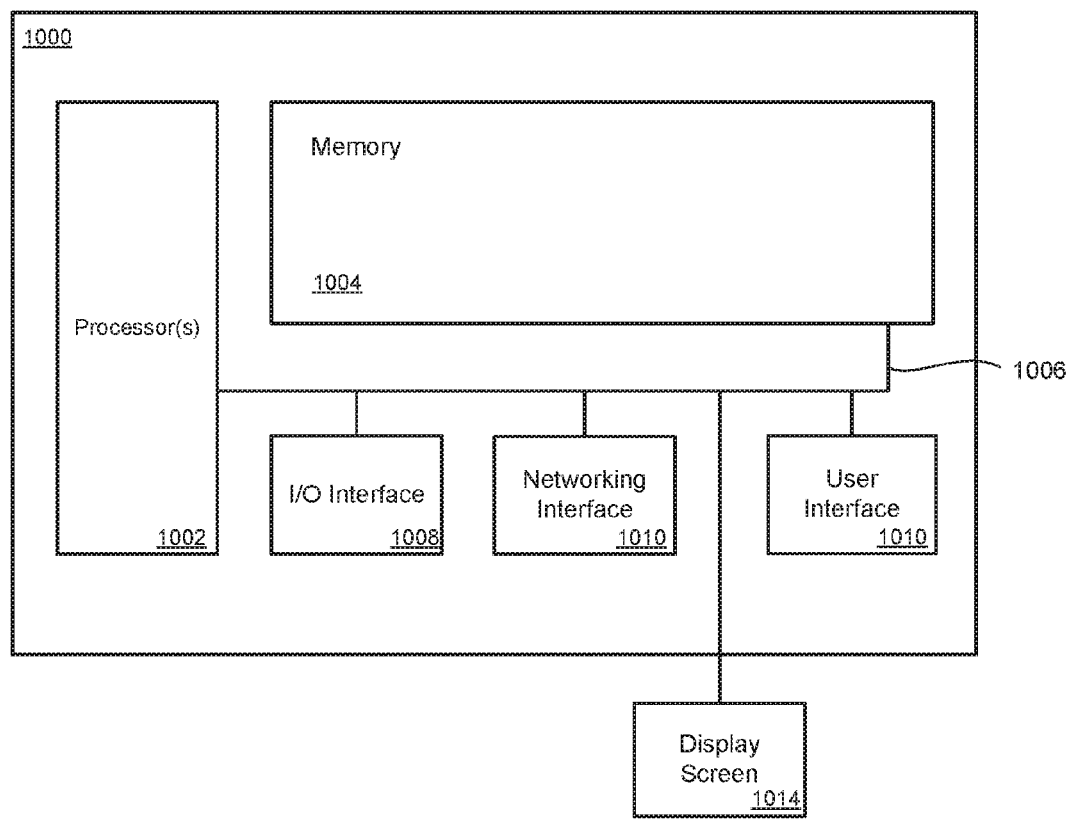
FIG. 10 illustrates a computing system that includes a data storage device in accordance with an example embodiment.

FIG. 10 illustrates a general computing system or device 1000 that can be employed in the present technology. The computing system 1000 can include a processor 1002 in communication with a memory 1004. The memory 1004 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1000 additionally includes a local communication interface 1006 for connectivity between the various components of the system. For example, the local communication interface 1006 can be a local data bus and/or any related address or control busses as may be desired.

The computing system or device 1000 can also include an I/O (input/output) interface 1008 for controlling the I/O functions of the system, as well as for I/O connectivity to devices outside of the computing system 1000. A network interface 1010 can also be included for network connectivity. The network interface 1010 can control network communications both within the system and outside of the system. The network interface can include a wired interface, a wireless interface, a Bluetooth interface, optical interface, and the like, including appropriate combinations thereof. Furthermore, the computing system 1000 can additionally include a user interface 1012, a display device 1014, as well as various other components that would be beneficial for such a system.

The processor 1002 can be a single or multiple processors, and the memory 1004 can be a single or multiple memories. The local communication interface 1006 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided, a system for performing read operations, comprising:
- an array of memory cells;
- a first decode circuit;
- a second decode circuit; and
- a voltage regulator configured to perform a read operation by providing, based on one or more signals received from at least one of the first decode circuit or the second decode circuit, a voltage to a selected plane or a selected sub-plane in the array of memory cells.

In one example of the system for performing read operations, the voltage is provided to the selected plane in the array of memory cells during a plane read operation.

In one example of the system for performing read operations, the voltage is provided to the selected sub-plane in the array of memory cells during a sub-plane read operation.

In one example of the system for performing read operations, the selected plane is not exposed to loads associated with remaining planes in the array of memory cells.

In one example of the system for performing read operations, the remaining planes in the array of memory cells are disabled when the voltage is provided to the selected plane.

In one example of the system for performing read operations, the selected sub-plane is not exposed to loads associated with remaining sub-planes in the array of memory cells.

In one example of the system for performing read operations, the remaining sub-planes in the array of memory cells are disabled when the voltage is provided to the selected sub-plane.

In one example of the system for performing read operations, the voltage regulator is configured to provide the voltage to a global bit line in the selected plane or the selected sub-plane in the array of memory cells.

In one example of the system for performing read operations, the voltage regulator is configured to provide the voltage to the selected plane based on a signal received from the first decode circuit, wherein the signal includes a first bit pattern to indicate the selected plane, and a number of bits included in the first bit pattern depends on a number of planes in the array of memory cells.

In one example of the system for performing read operations, the voltage regulator is configured to provide the voltage to the selected sub-plane based on signals received from the first decode circuit and the second decode circuit, wherein the signals include a first bit pattern and a second bit pattern to indicate the selected sub-plane, wherein a number of bits in the first bit pattern depends on a number of planes in the array of memory cells and a number of bits in the second bit pattern depends on a number of sub-planes for each plane in the array of memory cells.

In one example of the system for performing read operations, the first decode circuit and the second decode circuit are operable to isolate a global word line load for each plane or sub-plane in the array of memory cells, and the global word line load includes a global word line capacitance.

In one example of the system for performing read operations, the system is a NAND memory device.

In one example there is provided a memory device operable to perform read operations, comprising:
an array of memory cells;
a decode circuit; and
a voltage regulator configured to perform a read operation by providing, based on a signal received from the decode circuit, a voltage to a global bit line in a selected plane in the array of memory cells, and remaining planes in the array of memory cells are not exposed to the voltage provided to the global bit line in the selected plane.

In one example of the memory device operable to perform read operations, the voltage is provided to the selected plane in the array of memory cells during a plane read operation.

In one example of the memory device operable to perform read operations, the remaining planes in the array of memory cells are disabled when the voltage is provided to the global bit line in the selected plane.

In one example of the memory device operable to perform read operations, the voltage regulator is configured to provide the voltage to the selected plane based on the signal received from the decode circuit, wherein the signal includes a defined bit pattern to indicate the selected plane, and a number of bits in the defined bit pattern depends on a number of planes in the array of memory cells.

In one example of the memory device operable to perform read operations, the decode circuit is operable to isolate a global word line load for each plane in the array of memory cells, and the global word line load includes a global word line capacitance.

In one example of the memory device operable to perform read operations, the voltage regulator is positioned outside the array of memory cells within the memory device.

In one example of the memory device operable to perform read operations, the memory device is a NAND memory device.

In one example there is provided a method for performing read operations on a memory device, the method comprising:
receiving, at a voltage regulator in the memory device, one or more signals from at least one of a first decode circuit in the memory device or a second decode circuit in the memory device, wherein the one or more signals enable the voltage regulator to perform a read operation; and
applying, using the voltage regulator, a voltage to a global bit line in a selected plane or a selected sub-plane in the array of memory cells to perform the read operation in accordance with the one or more signals received from at least one of the first decode circuit or the second decode circuit.

In one example of the method for performing read operations, the method further comprises applying the voltage to the selected plane based on a first bit pattern included in the one or more signals received from the first decode circuit.

In one example of the method for performing read operations, the method further comprises applying the voltage to the selected sub-plane based on a first bit pattern and a second bit pattern included in the one or more signals received from the first decode circuit and the second decode circuit.

In one example of the method for performing read operations, the method further comprises applying the voltage to the global bit line in the selected plane during a plane read operation.

In one example of the method for performing read operations, the method further comprises applying the voltage to the global bit line in the selected sub-plane during a sub-plane read operation.

In one example of the method for performing read operations, the selected plane is not exposed to loads associated with remaining planes in the array of memory cells, and the remaining planes in the array of memory cells are disabled when the voltage is provided to the selected plane.

In one example of the method for performing read operations, the selected sub-plane is not exposed to loads associated with remaining sub-planes in the array of memory cells, and the remaining sub-planes in the array of memory cells are disabled when the voltage is provided to the selected sub-plane.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A system for performing read operations, comprising:
an array of memory cells;
a first decode circuit;
a second decode circuit; and
a voltage regulator configured to perform a read operation by providing, based on one or more signals received from at least one of the first decode circuit or the second decode circuit, a voltage to a selected plane or a selected sub-plane in the array of memory cells, wherein either:
the voltage regulator is configured to provide the voltage to the selected plane based on a signal received from the first decode circuit, wherein the signal includes a first bit pattern to indicate the selected plane, and a number of bits included in the first bit pattern depends on a number of planes in the array of memory cells; or
the first decode circuit and the second decode circuit are operable to isolate a global word line load for each plane or sub-plane in the array of memory cells, and the global word line load includes a global word line capacitance.

2. The system of claim 1, wherein the voltage is provided to the selected plane in the array of memory cells during a plane read operation.

3. The system of claim 1, wherein the voltage is provided to the selected sub-plane in the array of memory cells during a sub-plane read operation.

4. The system of claim 1, wherein the selected plane is not exposed to loads associated with remaining planes in the array of memory cells.

5. The system of claim 4, wherein the remaining planes in the array of memory cells are disabled when the voltage is provided to the selected plane.

6. The system of claim 1, wherein the selected sub-plane is not exposed to loads associated with remaining sub-planes in the array of memory cells.

7. The system of claim 6, wherein the remaining sub-planes in the array of memory cells are disabled when the voltage is provided to the selected sub-plane.

8. The system of claim 1, wherein the voltage regulator is configured to provide the voltage to a global bit line in the selected plane or the selected sub-plane in the array of memory cells.

9. The system of claim 1, wherein the voltage regulator is configured to provide the voltage to the selected sub-plane based on signals received from the first decode circuit and the second decode circuit, wherein the signals include a first bit pattern and a second bit pattern to indicate the selected sub-plane, wherein a number of bits in the first bit pattern depends on a number of planes in the array of memory cells and a number of bits in the second bit pattern depends on a number of sub-planes for each plane in the array of memory cells.

10. The system of claim 1, wherein the system is a NAND memory device.

11. A memory device operable to perform read operations, comprising:
an array of memory cells;
a decode circuit; and
a voltage regulator configured to perform a read operation by providing, based on a signal received from the decode circuit, a voltage to a global bit line in a selected plane in the array of memory cells, and remaining planes in the array of memory cells are not exposed to the voltage provided to the global bit line in the selected plane;
wherein the voltage regulator is configured to provide the voltage to the selected plane based on the signal received from the decode circuit, wherein the signal includes a defined bit pattern to indicate the selected plane, and a number of bits in the defined bit pattern depends on a number of planes in the array of memory cells.

12. The memory device of claim 11, wherein the voltage is provided to the selected plane in the array of memory cells during a plane read operation.

13. The memory device of claim 11, wherein the remaining planes in the array of memory cells are disabled when the voltage is provided to the global bit line in the selected plane.

14. The memory device of claim 11, wherein the decode circuit is operable to isolate a global word line load for each plane in the array of memory cells, and the global word line load includes a global word line capacitance.

15. The memory device of claim 11, wherein the voltage regulator is positioned outside the array of memory cells within the memory device.

16. The memory device of claim 11, wherein the memory device is a NAND memory device.

17. A method for performing read operations on a memory device, the method comprising:
receiving, at a voltage regulator in the memory device, one or more signals from at least one of a first decode circuit in the memory device or a second decode circuit in the memory device, wherein the one or more signals enable the voltage regulator to perform a read operation; and
applying, using the voltage regulator, a voltage to a global bit line in a selected plane or a selected sub-plane in the memory device to perform the read operation in accordance with the one or more signals received from at least one of the first decode circuit or the second decode circuit.

18. The method of claim 17, further comprising applying the voltage to the selected plane based on a first bit pattern included in the one or more signals received from the first decode circuit.

19. The method of claim 17, further comprising applying the voltage to the selected sub-plane based on a first bit pattern and a second bit pattern included in the one or more signals received from the first decode circuit and the second decode circuit.

20. The method of claim 17, further comprising applying the voltage to the global bit line in the selected plane during a plane read operation.

21. The method of claim 17, further comprising applying the voltage to the global bit line in the selected sub-plane during a sub-plane read operation.

22. The method of claim 17, wherein the selected plane is not exposed to loads associated with remaining planes in the memory device, and the remaining planes in the memory device are disabled when the voltage is provided to the selected plane.

23. The method of claim 17, wherein the selected sub-plane is not exposed to loads associated with remaining sub-planes in the memory device, and the remaining sub-planes in the memory device are disabled when the voltage is provided to the selected sub-plane.

* * * * *